United States Patent
Komai et al.

(10) Patent No.: US 8,034,704 B2
(45) Date of Patent: Oct. 11, 2011

(54) METHOD FOR MANUFACTURING SEMICONDUCTOR DEVICE AND SEMICONDUCTOR DEVICE

(75) Inventors: Naoki Komai, Kanagawa (JP); Takuya Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 801 days.

(21) Appl. No.: 11/945,736

(22) Filed: Nov. 27, 2007

(65) Prior Publication Data

US 2008/0136023 A1 Jun. 12, 2008

(30) Foreign Application Priority Data

Dec. 6, 2006 (JP) .................. 2006-329179

(51) Int. Cl.
 *H01L 21/44* (2006.01)
 *H01L 21/4763* (2006.01)
(52) U.S. Cl. ........ 438/613; 438/614; 438/622; 438/667; 257/E21.597
(58) Field of Classification Search .................. 438/667, 438/613, 614, 622; 257/E21.597
See application file for complete search history.

(56) References Cited

U.S. PATENT DOCUMENTS

| | | | | |
|---|---|---|---|---|
| 6,239,491 | B1 * | 5/2001 | Pasch et al. | 257/750 |
| 6,730,950 | B1 * | 5/2004 | Seshadri et al. | 257/295 |
| 6,908,856 | B2 * | 6/2005 | Beyne et al. | 438/667 |
| 7,282,431 | B2 * | 10/2007 | Kang et al. | 438/612 |
| 7,354,798 | B2 * | 4/2008 | Pogge et al. | 438/109 |
| 7,528,068 | B2 * | 5/2009 | Soejima et al. | 438/667 |
| 2001/0005046 | A1 * | 6/2001 | Hsuan et al. | 257/686 |

FOREIGN PATENT DOCUMENTS

| | | |
|---|---|---|
| JP | 2002-050736 | 2/2002 |
| JP | 2004-241479 | 8/2004 |
| JP | 2005-243689 | 8/2005 |
| JP | 2005-294582 | 10/2005 |
| JP | 2006-041450 | 2/2006 |
| WO | 2005/086216 | 9/2005 |

OTHER PUBLICATIONS

Office Action issued by the Japanese Patent Office on Mar. 31, 2009 in connection to related Japanese Patent Application No. 2006-329179.

* cited by examiner

*Primary Examiner* — Walter L Lindsay, Jr.
*Assistant Examiner* — Ron Pompey
(74) *Attorney, Agent, or Firm* — SNR Denton US LLP

(57) ABSTRACT

A method for manufacturing a semiconductor device includes the steps of providing an element forming layer on a first surface of a semiconductor substrate, and providing an external connection terminal on a second surface of the semiconductor substrate opposite to the first surface so that the external connection terminal is electrically connected to the element forming layer through a via hole. The via hole is formed through the steps of forming a buried conductor layer on the first surface so as to electrically insulate the buried conductor layer from the semiconductor substrate, forming a communication hole on the second surface so as to communicate it with the buried conductor layer, and electrically connecting the buried conductor layer and the communication hole.

7 Claims, 14 Drawing Sheets

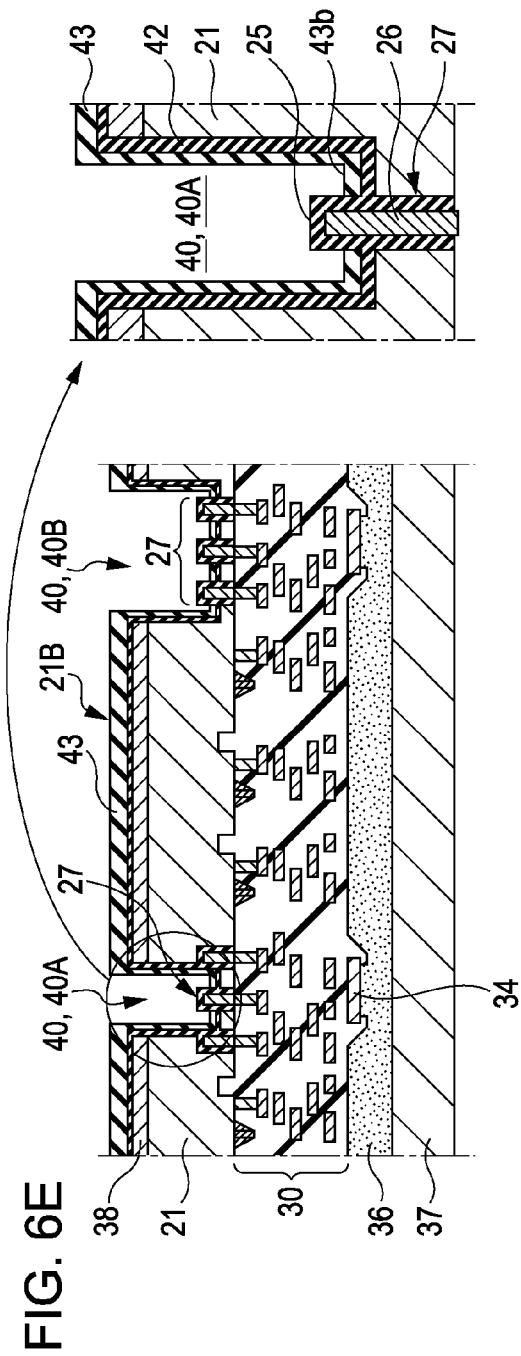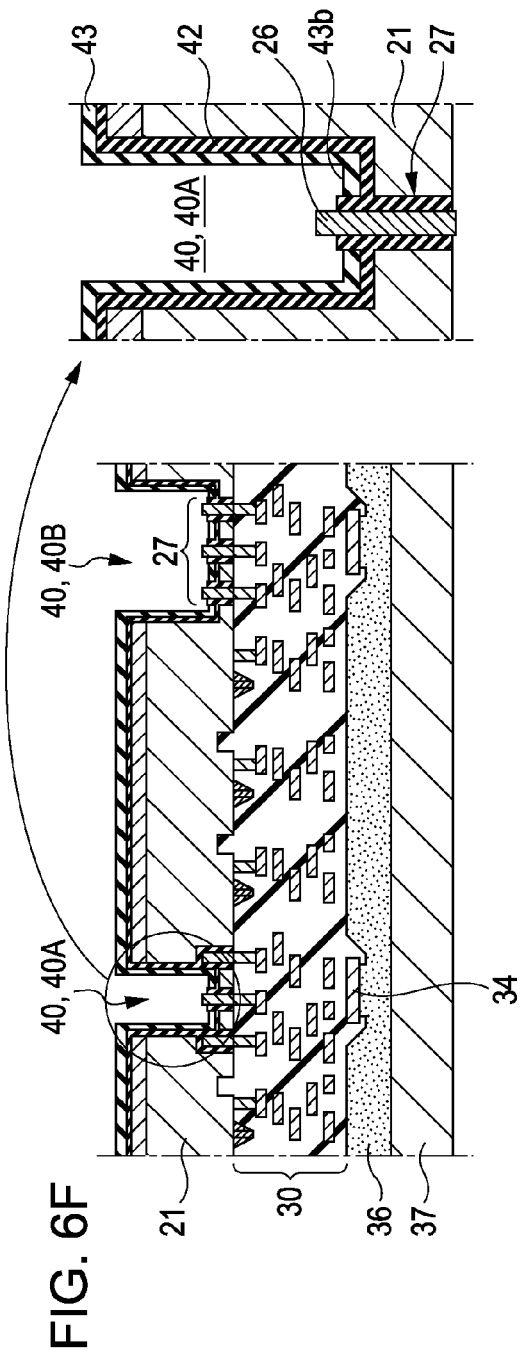

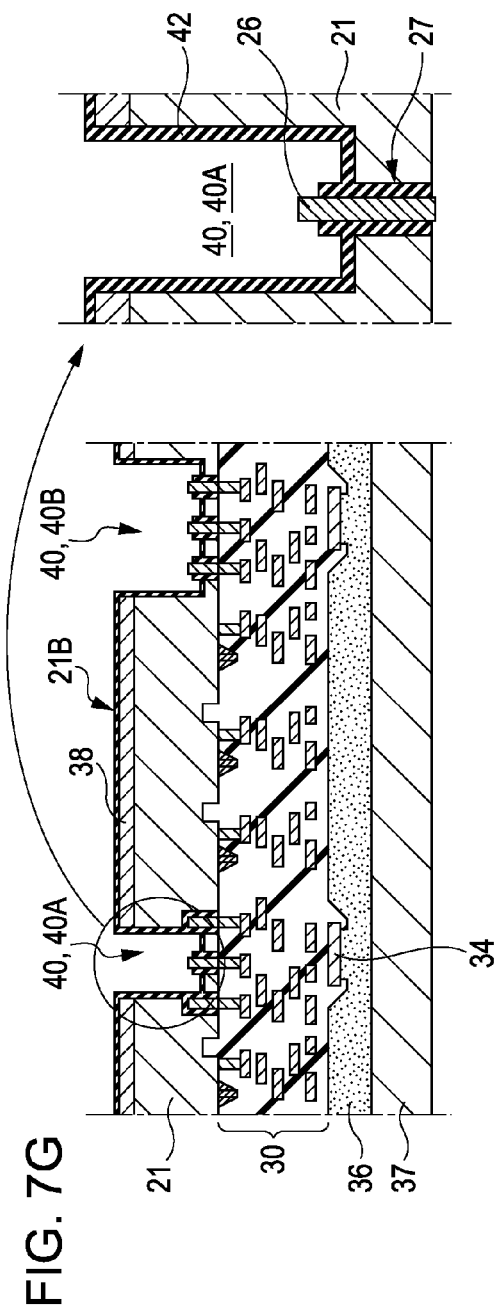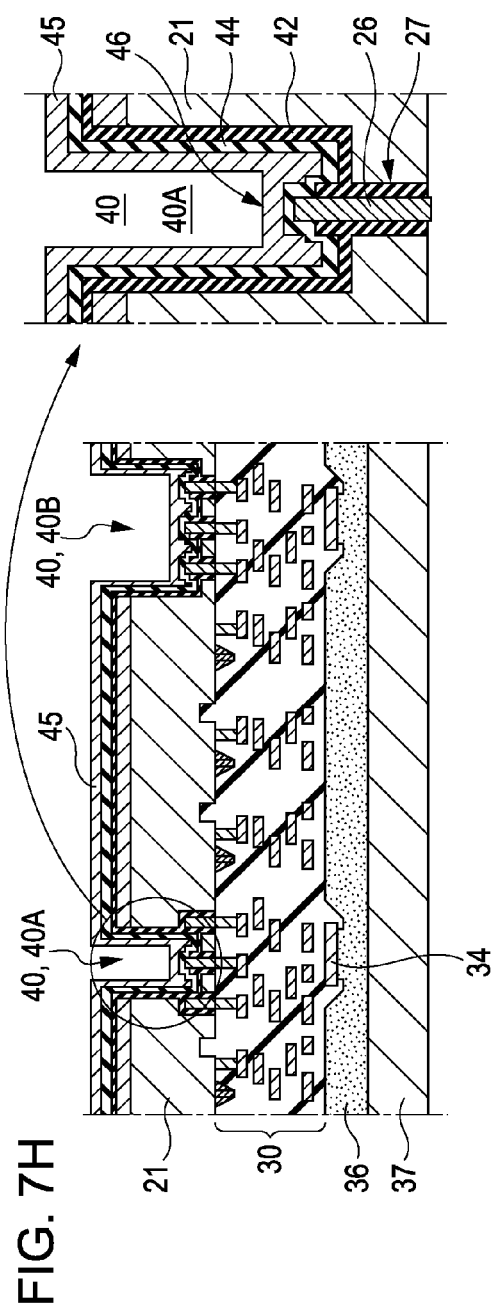

METHOD FOR MANUFACTURING SEMICONDUCTOR DEVICE AND SEMICONDUCTOR DEVICE

CROSS REFERENCES TO RELATED APPLICATIONS

The present invention contains subject matter related to Japanese Patent Application JP 2006-329179 filed in the Japanese Patent Office on Dec. 6, 2006, the entire contents of which are incorporated herein by reference.

BACKGROUND OF THE INVENTION

1. Field of the Invention

The present invention relates to a method for manufacturing a semiconductor device including via holes passing through a semiconductor substrate and to a semiconductor device.

2. Description of the Related Art

Electronic components have recently been increased in integration density and mounting density accompanying the demand for improving the functions of electronic apparatuses and compacting them. Therefore, MCM (multi-chip module) or SIP (system-in package) type semiconductor devices using flip-chip mounting are becoming mainstream. Such semiconductor devices include a semiconductor device having a chip-on-chip (COC) structure in which a second semiconductor chip is flip-chip connected on a first semiconductor chip.

FIG. 16 is a sectional view showing the schematic constitution of a general semiconductor device having a chip-on-chip structure. The semiconductor device shown in FIG. 16 includes a first semiconductor chip 1 and a second semiconductor chip 2. The second semiconductor chip 2 is flip-chip mounted at a substantially central portion of a main surface of the first semiconductor chip 1 using a plurality of bumps 3. Also, a plurality of electrode pads 4 is formed in the peripheral region of the first semiconductor chip 1 so as to surround a region in which the semiconductor chip 2 is mounted. Further, a dam 5 is provided between the chip mounting region and the region in which the electrode pads 4 are formed on the main surface of the first semiconductor chip 1. The dam 5 is formed in a frame shape having a rectangular planar form so as to surround the chip mounting region. Further, the space between the first semiconductor chip 1 and the second semiconductor chip 2 is filled with an under fill material 6 inside the dam 5.

The semiconductor device having the above-described constitution is bonded onto a mounting substrate 7 through an adhesive layer 8 as shown in FIG. 16, and then the electrode pads 4 on the first semiconductor chip 1 are electrically connected to lands 9 on the mounting substrate 7 through bonding wires 10.

For semiconductor devices with a chip-on-chip structure, there has recently been demand for increasing the signal processing speed and decreasing the mounting area. Namely, a semiconductor device to be mounted in a wire bonding system shown in FIG. 16 has problems of signal transmission delay due to the wire length of the bonding wires 10 and securement of a mounting area necessary for drawing the bonding wires 10.

Therefore, as schematically shown in FIG. 17, via holes (through electrodes) 11 are formed in the first semiconductor chip 1 in order to connect layers of the bumps 3 bonded to the upper second semiconductor chip 2 and bumps 12 bonded to the lower mounting substrate 7. This is very advantageous because an increase in the signal transmission speed and a decrease in the mounting area can be realized at the same time.

On the other hand, when via holes are formed, in order to realize a shorter processing time and a narrower pitch, it is necessary to thin a wafer (semiconductor substrate). In order to thin a wafer, back grinding is generally performed. In a method known as a first method for forming via holes, through electrodes are buried in a surface of the wafer, and then the bottoms of the through electrodes are exposed to the outside by grinding the back side of the wafer to form terminal surfaces (refer to Japanese Patent No. 2004-241479).

In a method proposed as a second method for forming via holes, contact holes are formed from the back side of a wafer having an element forming layer including a semiconductor element and wiring formed on the front side thereof so that the contact holes communicate with the wiring layer, and then the contact holes are made conductive to form via holes (refer to Japanese Unexamined Patent Application Publication No. 2006-41450).

In another method known as a third method for forming via holes, through holes are formed from the front side of a semiconductor substrate on which an element forming layer is formed so as to pass through the wafer, and then the through holes are made conductive to form via holes (refer to Japanese Unexamined Patent Application Publication No. 2002-50736).

SUMMARY OF THE INVENTION

However, in the first via forming method in which the bottom of a buried conductor layer is exposed by grinding the back side of a wafer, a via hole is entirely composed of the buried conductor layer to cause a limitation of the constituent material of the conductor layer buried in the wafer, thereby failing to achieve desired element characteristics in some cases.

For example, when the formed via holes constitute a wiring layer of a power supply system or a high-frequency signal transmission system, the buried conductor layer is preferably composed of a metal material with low resistance, such as Cu (copper) or W (tungsten). However, the thermal expansion coefficients of Cu and W greatly differ from that of Si (silicon) constituting the wafer, and thus the wafer is likely to be cracked during heating in a subsequent element forming step. On the other hand, polysilicon (poly-Si) having a thermal expansion coefficient equivalent to that of Si can be used as a constituent material for the buried conductor layer. In this case, however, it is difficult to form low-resistance via holes, leaving problems with power supply and transmission speed. Further, the influence of a difference in thermal expansion coefficient between the buried conductor layer and the wafer can be decreased by ultra-thinning the wafer. However, when the wafer becomes ultrathin, the element characteristics may be changed or handleability may be decreased to degrade productivity.

In the second via forming method, it is necessary that a contact hole is formed from the back side of the wafer to reach a desired wiring region of the element forming layer. However, the limit of the accuracy of alignment from the back side of the wafer is 0.5 μm and thus does not reach a necessary spec. Therefore, when the contact hole is formed by a photolithographic technique, there is the problem that a mask pattern cannot be formed with required alignment accuracy, and it is difficult to cause the wiring layer to function as a sufficient etching stopper in processing because of its small thickness.

In the third via forming method, a through hole is formed on the surface side of a semiconductor substrate on which an element forming layer is formed so as to pass through the wafer. Therefore, it is necessary to ultra thin the wafer so that the through hole can be formed. As described above, when the wafer is ultra-thinned, handleability of the wafer in a subsequent step is decreased to degrade productivity.

It is desirable to provide a method for manufacturing a semiconductor device which is capable of decreasing the influence of a difference in thermal expansion between a semiconductor substrate and a buried conductor layer and forming desired via holes without the need for high alignment accuracy and ultra thinning of a wafer.

In accordance with an embodiment of the present invention, a method for manufacturing a semiconductor device includes the steps of providing an element forming layer on a first surface of a semiconductor substrate and providing an external connection terminal on a second surface of the semiconductor substrate opposite to the first surface so that the external connection terminal is electrically connected to the element forming layer through a via hole. The via hole is formed through the steps of forming a buried conductor layer on the first surface so as to electrically isolate the buried conductor layer from the semiconductor substrate, forming a communication hole in the second surface so as to communicate the hole with the buried conductor layer, and electrically connecting the buried conductor layer and the communication hole.

In the method for manufacturing the semiconductor device, the buried conductor layer is formed on the first surface, the communication hole communicating with the buried conductor layer is formed on the second surface, and then the buried conductor layer and the communication hole are electrically connected to each other to form the via hole for electrically connecting the first surface and the second surface of the semiconductor substrate. As a result, the influence of a difference in thermal expansion between the semiconductor substrate and the buried conductor layer can be decreased as compared with a case in which the via hole is entirely composed of the buried conductor layer, thereby avoiding the problem of substrate cracking due to a difference in thermal expansion. Since the via hole is formed by processing the front and back surfaces of the substrate, the shape of the via hole can be easily controlled, and ultra thinning of the substrate is not required.

The conductive material constituting the buried conductor layer is not particularly limited, and a metal material such as Cu or W and a semi-metal material such as polysilicon can be used. It is necessary to electrically insulate the buried conductor layer from the semiconductor substrate. However, an insulating film is not particularly limited, and, for example, a silicon nitride film is preferred. The method of forming the buried conductor layer includes forming a hole or groove with a bottom in which the conductive material is to be buried, forming the insulating film, and then filling the hole or groove with the conductive material.

The step of forming the buried conductor layer may be performed before or after the element forming layer is formed on the first surface of the semiconductor substrate. When the buried conductor layer is formed before the element forming layer is formed, in order to suppress warping or cracking of the substrate due to heat treatment required for forming the element forming layer, a material (e.g., polysilicon) having a thermal expansion coefficient equivalent to that of the semiconductor substrate is preferably used as the constituent material of the buried conductor layer. On the other hand, when the buried conductor layer is formed after the element forming layer is formed, a metal material such as Cu or W can be used as the constituent material of the buried conductor layer. In addition, the formation timing of the buried conductor layer and the type of the material thereof may be selected according to the type of the intended via wiring system (e.g., a power supply system, a signal transmission system, or the like).

In the method for manufacturing the semiconductor device, the connection hole is formed from the second surface to communicate with the buried conductor layer formed on the first surface. Therefore, the communication hole can be formed without the need for high alignment accuracy as compared with a case in which a contact hole is formed toward a wiring layer in an element forming layer. Consequently, the via hole can easily be formed, and ultra thinning of the semiconductor substrate is not required, thereby improving workability and productivity. In this case, the width (or the diameter) of the communication hole can be determined to be larger than the width (or the diameter) of the buried conductor layer, and for example, larger than alignment accuracy.

When the communication hole is formed, the connection resistance of the via hole to be formed can be controlled. For example, a plurality of buried conductor layers is formed in parallel so that the electric resistance of the via hole can be controlled by controlling the number of the buried conductor layers connected to the communication hole. Alternatively, the electric resistance of the via hole can be controlled by controlling the connection length of the via hole to the buried conductor layer. Such a method can produce a desired electric resistance required for a via wiring system.

In the present invention, the step of electrically connecting the buried conductor layer and the communication hole includes the steps of isolating the inner surface of the communication hole, removing the insulating film covering the bottom of the buried conductor layer, and forming a conductor film covering the inner surface of the communication hole and the bottom of the buried conductor layer simultaneously.

In the step of removing the insulating film covering the bottom of the buried conductor layer, the communication hole is formed with a width (or diameter) larger than the width (or the diameter) of the buried conductor layer, an insulating protective film is formed so that the deposit at the bottom of the communication hole is larger than that at the bottom of the buried conductor layer, and the protective film formed at the bottom of the buried conductor layer is etched out so that the insulating film exposed in the communication hole is selectively etched out. As a result, the insulating film covering the bottom of the buried conductor layer can be securely removed while securing insulation of the bottom of the communication hole, thereby improving the reliability of electric connection between the buried conductor layer and the communication hole.

In accordance with another embodiment of the present invention, a semiconductor device includes an element forming layer formed on a first surface of a semiconductor substrate, an external connection terminal formed on a second surface opposite to the first surface of the semiconductor substrate, and a via hole for electrically connecting the element forming layer and the external connection terminal. The via hole includes a buried conductor layer formed on the first surface side, a communication hole formed on the second surface side, and a connecting layer for electrically connecting the buried conductor layer and the communication hole.

In the semiconductor device, the via hole passing through the semiconductor substrate includes the buried conductor layer formed on the first surface side of the semiconductor substrate and the communication hole formed on the second surface side. As a result, the influence of a difference in thermal expansion between the semiconductor substrate and the buried conductor layer can be decreased as compared with a case in which the via hole is entirely composed of the buried conductor layer, thereby avoiding the problem of substrate cracking due to a difference in thermal expansion.

The connecting layer can be composed of a conductor film which simultaneously covers the inner surface of the communication hole and the buried conductor layer exposed at the bottom of the communication hole. The conductor film may be conductor plating which covers the communication hole or a conductor layer which fills the communication hole. The external connection terminal can be composed of a plating bump or a solder bump formed on the conductor film.

The external connection terminal may be provided on a re-wiring layer formed on the second surface of the semiconductor substrate or provided at the formation position of the communication hole. The resulting semiconductor device can be preferably used as a lower semiconductor chip in a chip-on-chip structure semiconductor device.

As described above, according to the present invention, a via structure capable of preventing substrate cracking due to a difference in thermal expansion between a buried conductor layer and a semiconductor substrate can be stably formed without degrading workability and productivity.

BRIEF DESCRIPTION OF THE DRAWINGS

FIGS. 6E and 6F are sectional views of a principal portion, for illustrating the via connection processing step according to the first embodiment of the present invention;

FIGS. 7G and 7H are sectional views of a principal portion, for illustrating the via connection processing step according to the first embodiment of the present invention;

DESCRIPTION OF THE PREFERRED EMBODIMENTS

Embodiments of the present invention will be described with reference to the drawings.

First Embodiment

Figure 1:
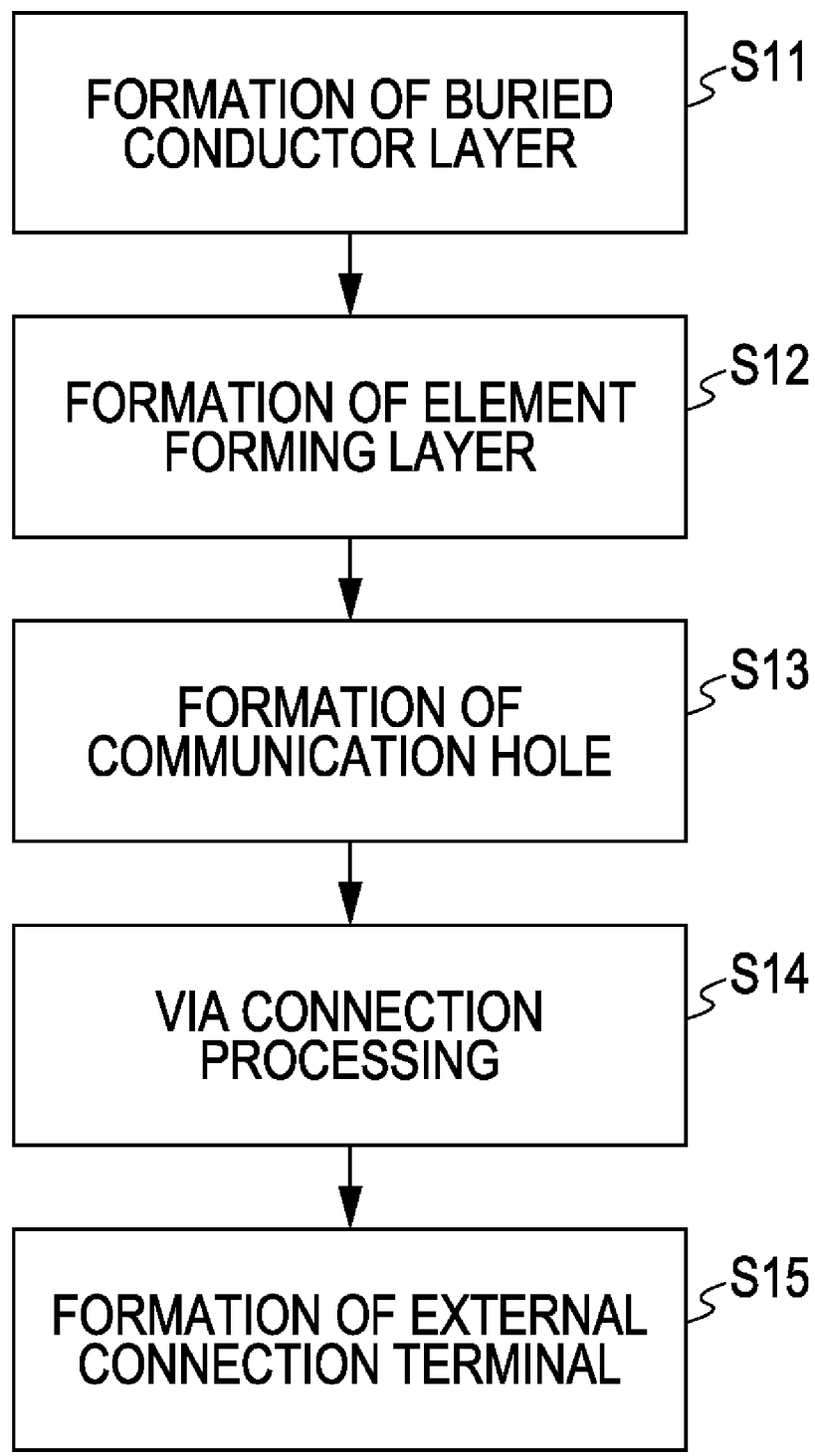
FIG. 1 is a flowchart illustrating a method for manufacturing a semiconductor device according to a first embodiment of the present invention.

FIG. 1 is a flowchart illustrating a method for manufacturing a semiconductor device according to a first embodiment of the present invention. The method for manufacturing a semiconductor device of this embodiment includes the steps of forming buried conductor layers on one (first surface) of the surfaces of a semiconductor substrate (S11), forming an element forming layer including semiconductor elements such as transistors, wiring, various insulating layers, electrode pads, etc. on the first surface of the semiconductor substrate (S12), forming communication holes in the other surface (second surface) of the semiconductor substrate so that the communication holes communicate with the buried conductor layers (S13), electrically connecting the buried conductor layers and the communication holes (S14), and forming external connection terminals on the second surface of the semiconductor substrate (S15).

Step of Forming Buried Conductor Layer

Figure 2A:
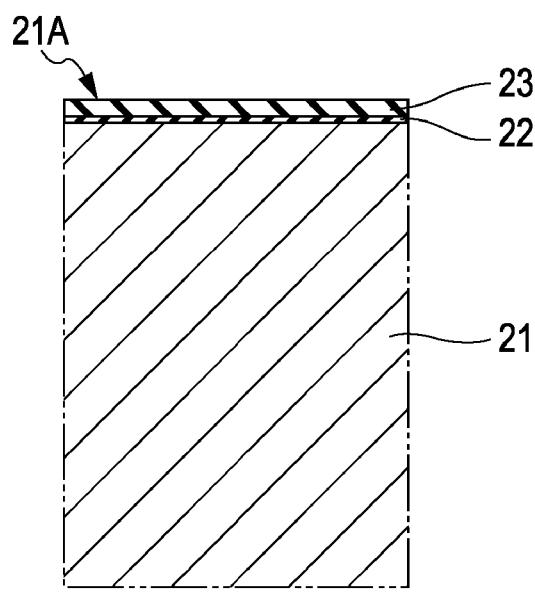
FIGS. 2A and 2B are sectional views of a principal portion, for illustrating the step of forming buried conductor layers according to the first embodiment of the present invention.

FIGS. 2A, 2B, and 3C to 3E are sectional views of a principal portion of the semiconductor substrate (wafer), for illustrating the step of forming buried conductor layers. As shown in FIG. 2A, a $SiO_2$ film 22 and a SiN film 23 are laminated in order on the first surface 21A of a substrate body (semiconductor substrate) 21 including a silicon substrate. The constituent materials, thicknesses, and combination of the insulating films 22 and 23 are arbitrarily selected and not limited to this example.

Figure 2B:
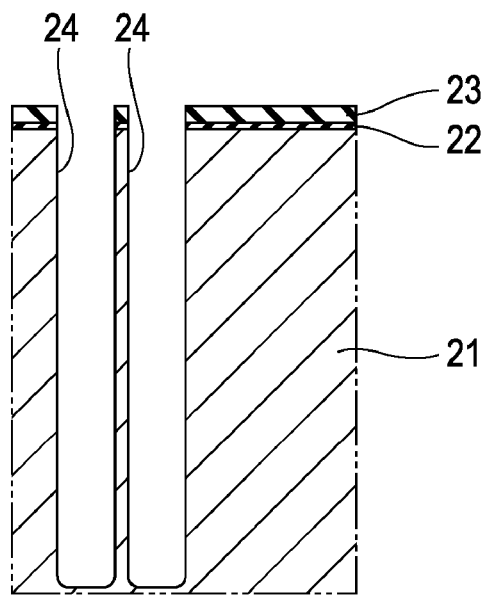

Next, as show in FIG. 2B, a required number of holes (or grooves) 24 with a bottom is formed at necessary positions in the first surface 21A of the substrate body 21. The holes 24 may be formed by a known photolithographic technique for forming, on the SiN film 23, a resist pattern (not shown in the drawing) having an opening at a position where each of the holes 24 is to be formed, and then etching the SiN layer 23, the $SiO_2$ film 22, and the substrate body 21 in order. The etching may be dry etching or wet etching, and the holes 24 may be round holes or square holes.

The depth of the holes 24 is determined so that the holes 24 do not pass through the substrate body 21 and, for example, 1 μm to 50 μm. The width (or the diameter) of the holes 24 is appropriately determined according to the number of the holes and the resistance and, for example, 0.5 μm to 5 μm.

Figure 3C:
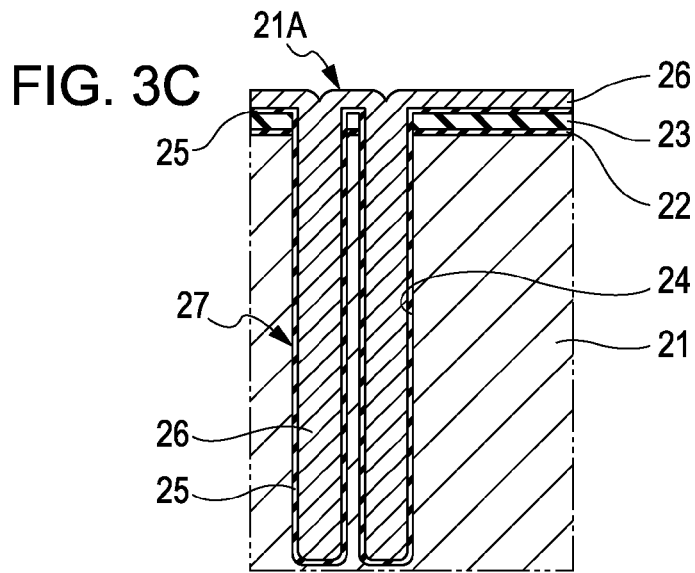
FIGS. 3C, 3D, and 3E are sectional views of a principal portion, for illustrating the step of forming buried conductor layers according to the first embodiment of the present invention.

Next, as shown in FIG. 3C, a SiN film is deposited on the first surface 21A of the substrate body 21 by, for example, a LPCVD (low pressure CVD) process to coat the inner walls (the inner peripheries and the bottoms) of the holes 24 with a SiN film (or a SiO$_2$ film) 25. Then, for example, an arsenic-containing polysilicon film 26 is deposited on the first surface 21A of the substrate body 21. As a result, buried conductor layers 27 each including the polysilicon film 26 filled in the hole 24 insulated with the SiN film 25.

Figure 3D:
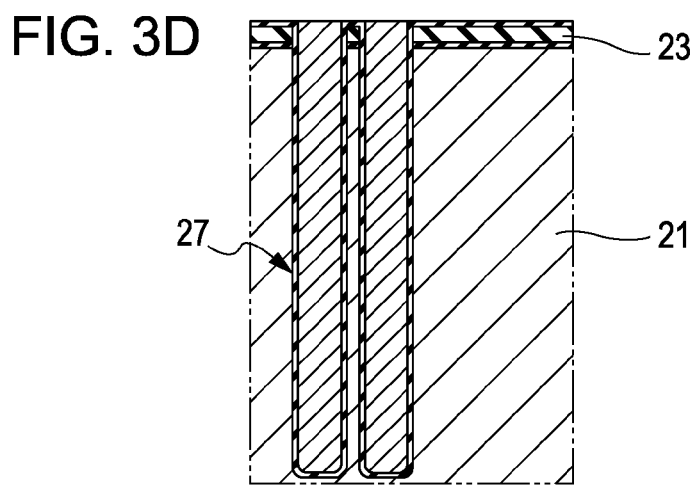
Figure 3E:
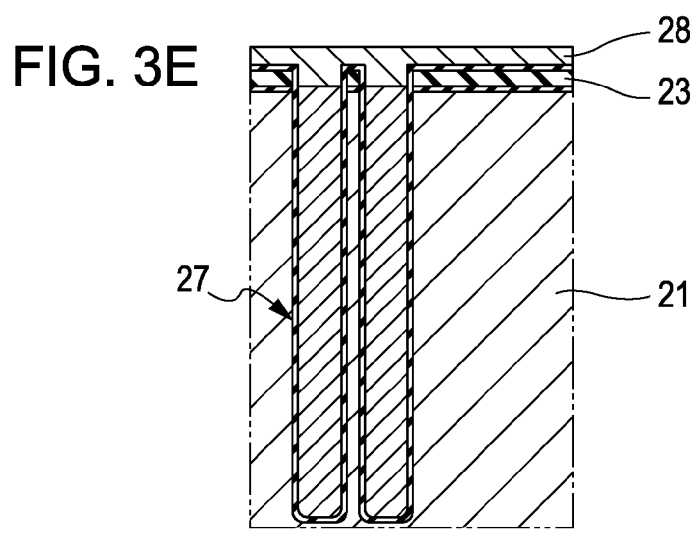

After the holes 24 is filled with the polysilicon film 26, excessive polysilicon film 26 remaining on the first surface 21A of the substrate body 21 is removed by CMP (Chemical Mechanical Polishing), and recesses are formed by an etch back process. Then, a SiO$_2$ film 28 is deposited on the first surface 21A of the substrate body 21 (FIGS. 3D and 3E). As described above, the step of forming the buried conductor layers (polysilicon plugs) 27 in the first surface 21A of the substrate body 21 is completed.

Step of Forming Element Forming Layer

Figure 4A:
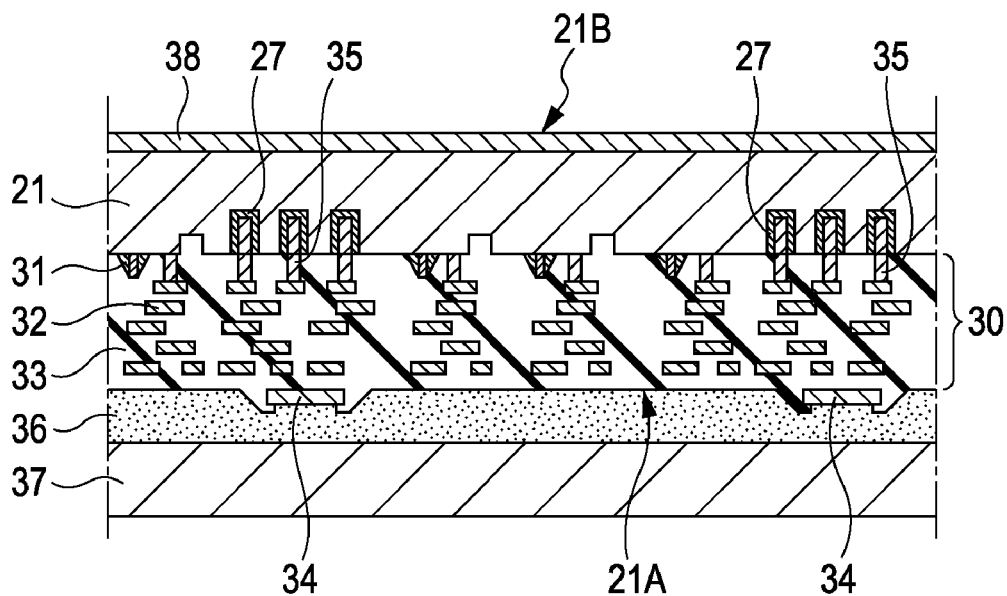
FIGS. 4A and 4B are sectional views of a principal portion, for illustrating the step of forming communication holes according to the first embodiment of the present invention.

Next, the element forming layer including semiconductor elements such as transistors, a wiring layer, an insulating layer, and electrode pads is formed on the first surface 21A of the substrate body 21. FIG. 4A schematically shows an example of the constitution of an element forming layer 30. In this figure, reference numeral 31 denotes a transistor element; reference numeral 32, a wiring layer; reference numeral 33, an insulating layer; and reference numeral 34, an electrode pad. The buried conductor layers 27 formed in the substrate body 21 are connected to the predetermined wiring layer 32 in the element forming layer 30 through interlayer connection portions 35 such as W (tungsten) plugs.

In this embodiment, the buried conductor layers 27 formed before the element forming layer 30 is formed are composed of, as a main component, polysilicon having the same thermal expansion coefficient as that of the substrate body 21. Therefore, in the heat treatment step required for forming the element forming layer 30, warping or cracking of the substrate due to a difference in thermal expansion between the substrate body 21 and the buried conductor layers 27 can be prevented.

Step of Forming Communication Hole

Next, the step of forming communication holes will be described. FIG. 4A is a schematic sectional side view of the semiconductor substrate in which the substrate body 21 is turned upside down. As shown in FIG. 4A, a support substrate 37 is bonded, through an adhesive material layer 36, to the first surface 21A of the substrate body 21 on which the element forming layer 30 has been formed. The support substrate 37 has the same size as that of the substrate body 21 and is used mainly for enhancing handleability of the substrate body 21. Then, if required, the substrate body 21 is thinned by back-grinding or back-etching the second substrate 21B opposite to the first surface 21A of the substrate body 21.

Figure 4B:
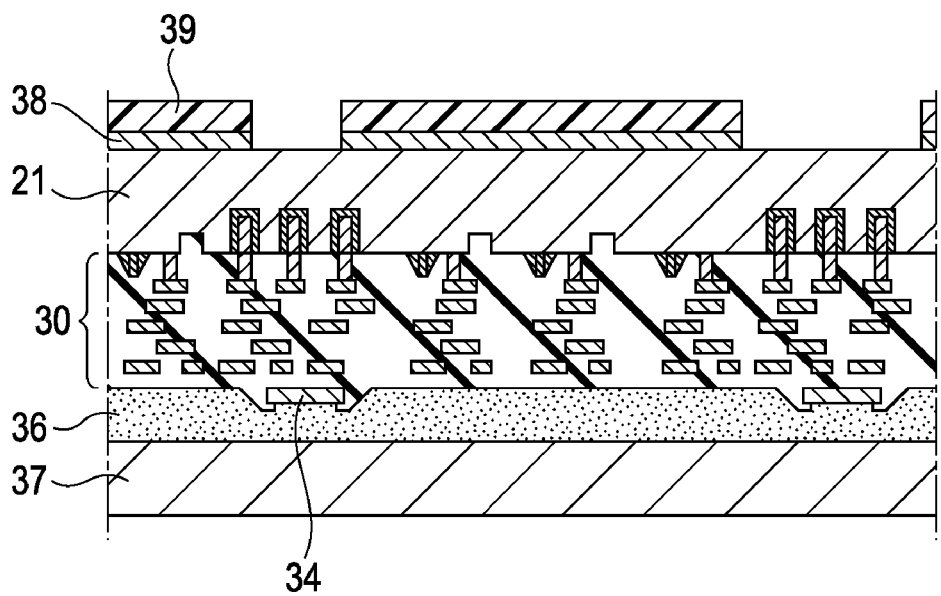

Next, as shown in FIG. 4B, a SiO$_2$ film 38 is deposited on the second surface 21B of the substrate body 21 by a CVD process or the like. The SiO$_2$ film 38 may be a natural oxide film. Then, a resist mask (or hard mask) 39 is formed on the SiO$_2$ film 38. The resist mask 39 has a predetermined pattern having an opening at a position where each of the communication holes is formed so that the SiO$_2$ film 38 exposed from the mask openings is etched off.

Figure 5C:
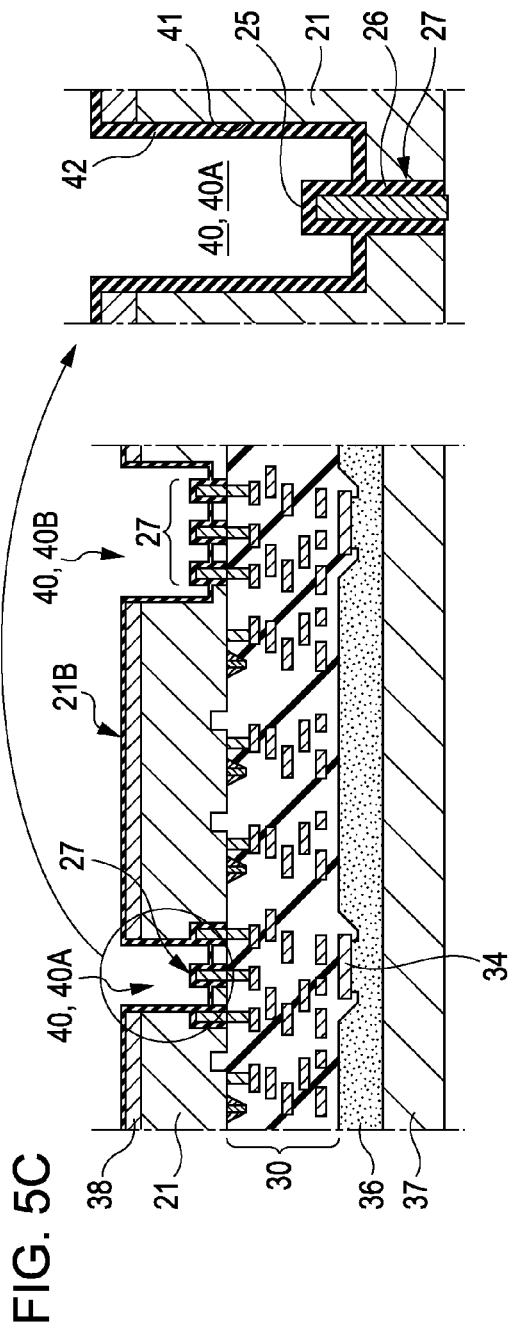
FIGS. 5C and 5D are sectional views of a principal portion, for illustrating the step of forming communication holes according to the first embodiment of the present invention.

Next, as shown in FIG. 5C, the second surface 21B of the substrate body 21 is etched using the SiO$_2$ film 38 as a mask to form contact holes 41 communicating with the buried conductor layers 27. The contact holes 41 are formed to such a depth that the buried conductor layers 27 are exposed at the bottoms of the contact holes 41. In this embodiment, in forming the contact holes 41, the etching amount is controlled by controlling the etching time. The openings of the contact holes 41 may be round or square openings.

Next, a SiN film (or SiO$_2$ film) 42 is formed on the second surface 21B of the substrate body 21 to coat the inner surfaces of the contact holes 41 with the SiN film 42. In this embodiment, the SiN film 42 is formed to a thickness of 15 nm by a plasma CVD process. As described above, communication holes 40 (41A, 40B) are formed in the substrate body 21.

In forming the communication holes 40 (contact holes 41), the openings of the mask (SiO$_2$ film 38) are aligned by a known infrared alignment method. In this embodiment, the width (or the diameter) of the communication holes 40 is larger than the width (or the diameter) of the buried conductor layers 27. Specifically, the width of the communication holes 40 is larger than the alignment accuracy of mask position alignment, and, for example, the diameter is 2 times as large as the alignment accuracy. Therefore, the communication holes 40 can be connected to the buried conductor layers 27 without the need for high alignment accuracy, thereby facilitating the work of forming the communication holes 40. In addition, when the communication holes 40 are formed, the work of connecting the communication holes 40 to the buried conductor layers 27 can be securely performed without ultra thinning of the substrate body 21.

The width of the communication holes 40 need not be the same at all positions, and the number of the buried conductor layers 27 connected to each of the communication holes 40 may be changed. FIG. 5C is shows an example in which the communication hole 40A on the left side is connected to one buried conductor layer 27, and the communication hole 40B on the right side is connected to the three buried conductor layers 27. As described below, via conduction resistance can be controlled by controlling the number of the buried conductor layers 27 connected to each communication hole 40.

Via Connection Processing Step

Next, the via connection processing step is performed. In the via connection processing step, a connecting layer is formed for electrically connecting the buried conductor layers 27 and the communication holes 40 to form via holes passing through the substrate body 21.

The SiN film 42 formed in the contact holes 41 constituting the respective contact holes 40 electrically insulates between the insides of the contact holes 40 and the substrate body 21. In forming the SiN film 42, the SiN film 42 is formed on the inner surfaces (inner peripheries and bottoms) of the contact holes 41 as well as the bottoms (the tops shown in FIG. 5C) of the buried conductor layers 27 which project from the bottoms of the contact holes 41. However, the material of the SiN film 42 is the same as that of the insulating film (SiN) 25 previously formed to cover the buried conductor layers 27. Therefore, in description below, the SiN film 42 formed at the bottoms of the buried conductor layers 27 is included in the SiN film which is previously formed to cover the bottoms of the buried conductor layers 27 and is represented by the SiN film 25.

In the via connection processing step, the insulating film (SiN film) 25 covering the bottoms of the buried conductor layers 27 which are exposed from the bottoms of the communication holes 40 is removed, and then a conductor film is formed to cover the inner walls of the communication holes 40 and the bottom conductor layers (polysilicon layers) of the buried conductor layers 27 at the same time. However, when the insulating film 25 coating the bottoms of the buried conductor layers 27 is etched off, not only the insulating film 25 at the bottoms of the buried conductor layers 27 but also the insulating film (SiN film) 42 covering the inner walls of the communication holes 40 are removed simultaneously. Therefore, electrical insulation cannot be achieved between the insides of the communication holes 40 and the substrate body 21.

Therefore, in this embodiment, in the step of removing the insulating film 25 coating the bottoms of the buried conductor layers 27, an electrically insulating protective film is formed so that the deposit amount at the bottoms of the communication holes 40 is larger than that of the buried conductor layers 27, and then the protective film formed at the bottoms of the buried conductor layers 27 is etched off so that the insulating film 25 exposed in the communication holes 40 is selectively etched off.

This step will be described in further detail below.

Figure 5D:
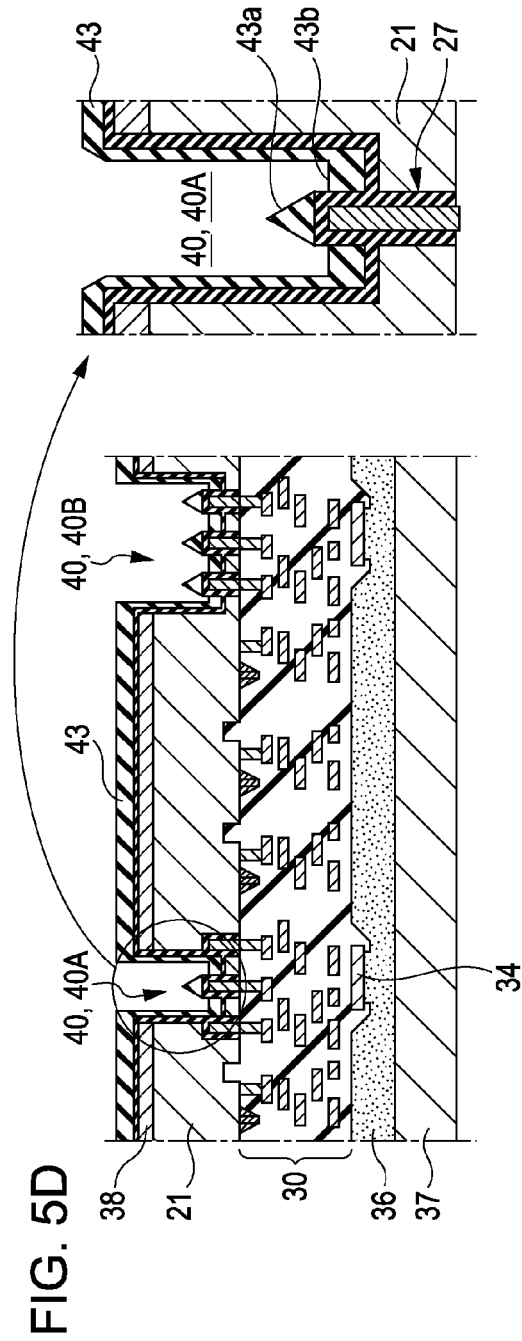

First, as shown in FIG. 5D, the insulating protective film 43 is formed on the second surface 21B of the substrate body 21. In this embodiment, the protective film 43 is a $SiO_2$ film formed by a high-density plasma (HDP) CVD process. The thickness is, for example, 500 nm. As a result, as shown in FIG. 5D, the deposit amount of the protective layers 43b formed at the bottoms of the communication holes 40 which are formed with a width larger than that of the buried conductor layers 27 can be made larger than that of the protective films 43a formed at the bottoms of the buried conductor layers 27.

In the HDP-CVD process, vapor phase epitaxy is performed on a substrate to which a bias is applied to sputter a surface to be treated, and a film is deposited at a bottom to a thickness larger than the coverage. The protective film 43 formed by this method is rounded off by the ion sputtering function. Consequently, the deposit amount of the protective layers 43b formed at the bottoms of the communication holes 40 is larger than that of the protective films 43a formed at the bottoms of the buried conductor layers 27.

Then, as shown in FIG. 6E, the protective films 43a formed immediately above the bottoms of the buried conductor layers 27 which are exposed from the bottoms of the communication holes 40 are removed by, for example, RIE (reactive ion etching) of the second surface 21B of the substrate body 21. Since the deposit amount of the protective layers 43b formed at the bottoms of the communication holes 40 is larger than that of the protective films 43a formed at the bottoms of the buried conductor layers 27, even when the insulating film 25 covering the bottoms of the buried conductor layers 27 is exposed, the protective films 34b formed at the bottoms of the communication holes 40 can be allowed to remain.

Next, as shown in FIG. 6F, the insulating film (SiN film) 25 on the buried conductor layers 27 exposed in the communication holes 40 is etched off. As an etchant (etching solution or etching gas), an etchant having such selectivity that the SiN film is etched but the $SiO_2$ film is not etched is used. For example, the insulating film 25 is removed by dry etching with a mixed gas of $CHF_3$, Ar, and $O_2$ ($CHF_3/Ar/O_2$=20/200/10 sccm). As a result, the polysilicon plugs 26 are exposed from the bottoms of the buried conductor layers 27. On the other hand, the SiN film 42 formed at the bottoms of the communication holes 40 remains unetched because of the protective film 43b covering the bottoms, and thus electric insulation between the insides of the communication holes 40 and the substrate body 21 can be securely maintained.

Next, as shown in FIG. 7G, the protective film 43 formed on the second surface 21B of the substrate body 21 and the inner walls of the communication holes 40 is etched off. Then, as shown in FIG. 7H, a Ti (TiN) or Ta (TaN)-based barrier metal 44 is formed on the substrate body 21 so as to simultaneously cover the inner walls of the communication holes 40 and the bottoms (polysilicon plugs 26) of the buried conductor layers 27. Then, a Cu seed layer 45 is formed on the barrier metal 44. As a result, via holes are completed to pass through the substrate body 21, for electrically connecting the inner surfaces of the communication holes 40 and the buried conductor layers 27.

The barrier metal 44 and the seed layer 45 constitute a conductor film which simultaneously covers the inner walls of the communication holes 40 and the bottoms of the buried conductor layers 27. Also, the SiN film 42, the barrier metal 44, and the seed layer 45 constitute the connecting layer 46 for electrically connecting the buried conductor layers 27 and the communication holes 40.

Before the barrier metal 44 is formed, the interfaces of the polysilicon plugs 26 of the buried conductor layers 27 are preferably cleaned by a reverse sputtering method using argon plasma. Although the protective film 43 adhering to the inner walls of the communication holes 40 is removed before the barrier metal 44 is formed, the barrier metal 44 may be formed on the protective film 43.

Step of Forming External Connection Terminal

Figure 8:
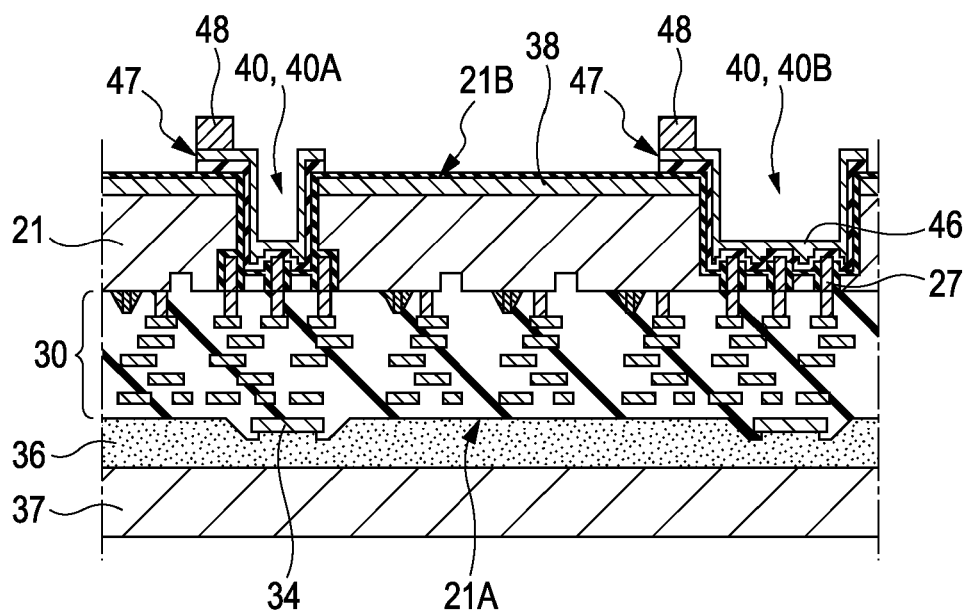
FIG. 8 is a sectional view of a principal portion illustrating the step of forming an external connection terminal according to the first embodiment of the present invention.

In this step, as shown in FIG. 8, external connection terminals 48 are formed by, electroplating, on the seed layer 45 formed on the second surface 21B of the substrate body 21, and then each of the seed layer 45 and the barrier metal 44 is patterned in a predetermined shape by a photolithographic technique to form a re-wiring layer 47.

The via connection resistance of the via holes formed as described above can be changed by controlling the number of the buried conductor layers 27 connected to each communication hole 40. Namely, in the example shown in FIG. 8, the via connection resistance of the communication hole 40B on the right side can be made lower than that of the communication hole 40A on the left side because of the larger number of the buried conductor layers 27 connected to the communication hole 40B. Therefore, the connection resistance of the via holes to be formed can be arbitrarily controlled by controlling the number of the buried conductor layers 27 connected to each communication hole 40. As a result, it is possible to appropriately design via holes according to the type (power supply system, signal transmission system, or the like) of the intended via wiring. Specifically, in application to wiring in a power supply system or high-frequency transmission system, a via structure is the same as the communication hole 40B in which a plurality of buried conductor layers 27 is connected for avoiding the influence of a voltage drop or delay of the signal transmission speed.

For example, when the polysilicon plugs 26 have a shape of 1 μm in diameter and 1 μm in depth, the plug resistance is 51Ω (resistivity 4 mΩcm). When the via resistance is set to 0.5Ω, 100 polysilicon plugs are formed with a via pitch of 1:1. The array form of plugs is, for example, 20 μm×20 μm square. For example, when the alignment deviation is 1 μm, the communication holes 40 are 25-μm square holes in view of the alignment deviation. The Cu layer (seed layer 45) covering the communication holes 40 is 10 μm or more in thickness. The communication holes may be filled with the Cu layer.

When the via resistance is set to 1Ω, the number of the polysilicon plugs is halved. When multiple via holes are formed in an array form of 7 μm×7 μm square, the communication holes are 9-μm square holes.

On the other hand, the via connection resistance can be controlled by controlling the connection length between the buried conductor layers 27 and the communication holes 40. For example, when the communication holes 40 are deeply formed, the projection length of the buried conductor layers 27 from the bottoms of the communication holes 40 is increased. As a result, when the insulating film 25 covering the bottoms of the buried conductor layers 27 is removed, the length of exposure of the polysilicon plugs 26 is increased, thereby increasing the connection area between the communication holes 40 and the polysilicon plugs 26 when the conductor film is formed and decreasing the via connection resistance. Conversely, when the communication holes 40 are shallow, the length of connection with the buried conductor layers 27 is decreased, thereby increasing the via connection resistance.

The via connection resistance can be controlled by changing the type of the conductor material constituting the buried conductor layers 27. Although, in this embodiment, the buried conductor layers 27 are composed of polysilicon, a metal material such as tungsten or copper can be used for forming the buried conductor layers. In this case, the via connection resistance can be further decreased. Examples of application of metal plugs will be described later.

Figure 9:
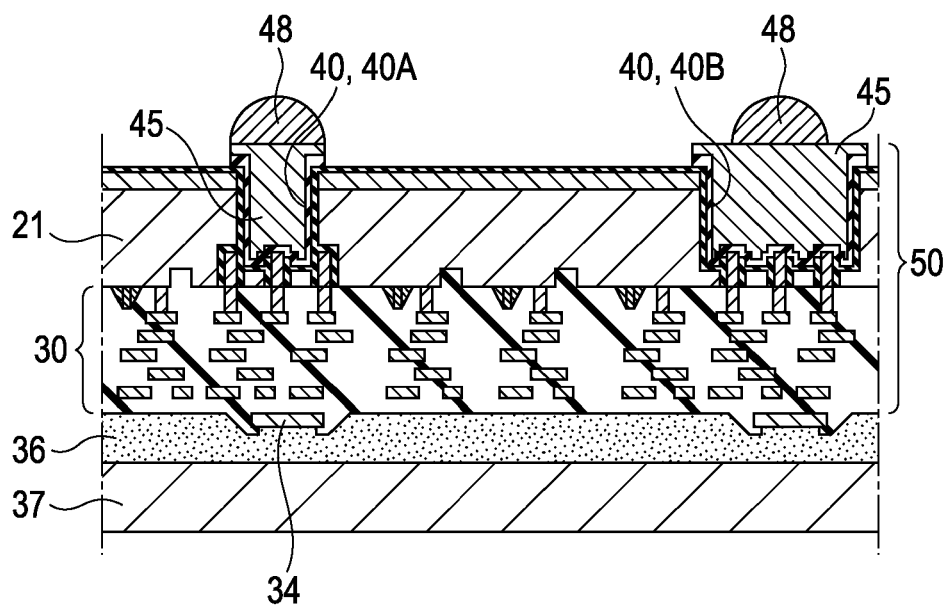
FIG. 9 is a sectional view of a principal portion showing a modified example of the constitution of an external connection terminal.

In the example shown in FIG. 8, the external connection terminals 48 are composed of Cu-plated bumps and provided at positions on the second surface 21B of the substrate body 21, which are offset from the positions immediately above the communication holes 40. The example of formation of the external connection terminals 48 is not limited to the above-mentioned example. For example, as shown in FIG. 9, each of the communication holes 40 is filled with the seed layer 45, and the external connection terminals 48 may be formed immediately above the communication holes 40. The external connection terminals 48 are not limited to plated bumps and may be solder bumps.

As described above, a semiconductor device 50 according to the present invention is manufactured, in which the buried conductor layers 27 are electrically connected to the external connection terminals 48 through the via holes. The semiconductor device 50 according to this embodiment can be used as a lower semiconductor chip in a semiconductor device having a COC structure.

Figure 10A:
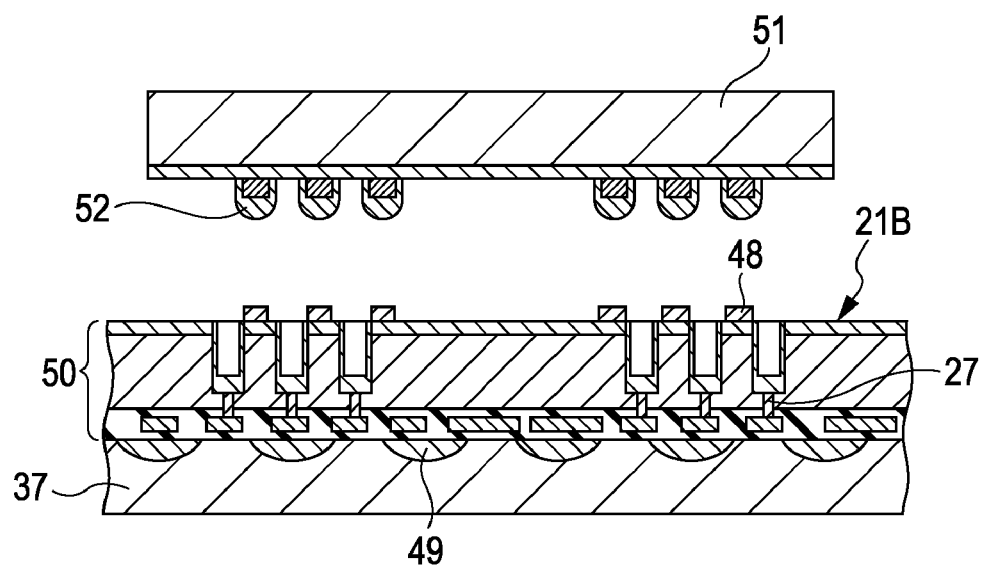
FIGS. 10A and 10B are schematic sectional view showing steps for manufacturing a COC structure semiconductor device using a semiconductor substrate manufactured according to the first embodiment of the present invention.
Figure 10B:
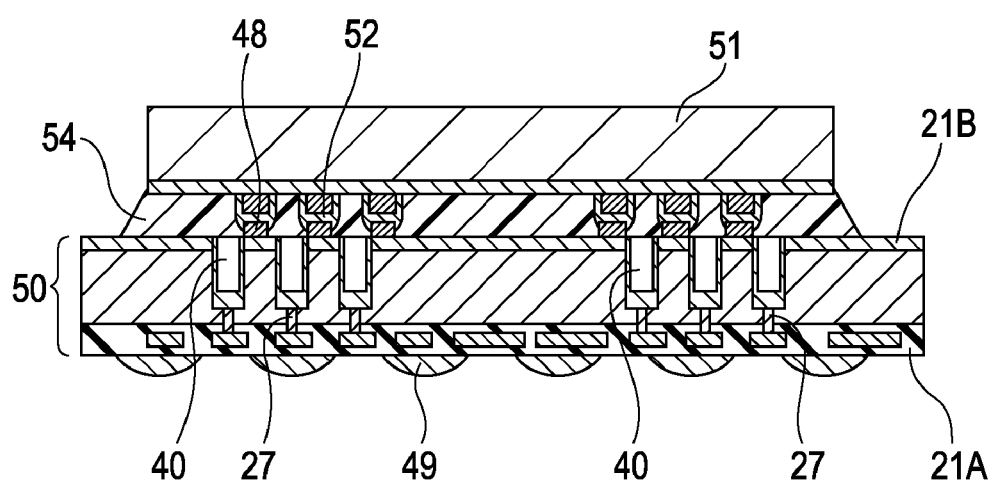

FIGS. 10A and 10B show an example in which an upper semiconductor chip 51 previously prepared is mounted on the second surface 21B of the manufactured semiconductor device 50 to form a COC-structure semiconductor device 53. In this case, the upper semiconductor chip 51 is flip-chip mounted on the lower semiconductor device 50, and external connection terminals (solder bumps) 52 on the semiconductor chip 51 are bonded to the external connection terminals 48 on the semiconductor device 50. After bonding, an underfill resin layer 54 is filled between the semiconductor device 50 and the semiconductor chip 51 and cured. Then, the semiconductor device 50 is cut into a chip size to form the semiconductor device 53 shown in FIG. 10B.

In the example shown in FIGS. 10A and 10B, the electrode pads 34 of the semiconductor device 50 are formed into bumps to form external terminals 49. Also, the external connection terminals 48 formed on the second surface 21B of the semiconductor device 50 are used as bonding terminals for the semiconductor chip 51. However, the electrode pads 34 on the semiconductor device 50 may be used as the bonding terminals, and the external connection terminals 48 may be used as bonding terminals for a mounting substrate.

As described above, in this embodiment, the via holes passing through the semiconductor substrate is formed using the buried conductor layers 27 formed on the first surface 21A of the semiconductor device 50 and the communication holes 40 formed on the second surface side. Therefore, the influence of a difference in thermal expansion between the semiconductor substrate and the buried conductor layers can be decreased as compared with a case in which via holes are composed of only the buried conductor layers, and thus the problem of substrate cracking due to the difference in thermal expansion can be avoided. Since the via holes are formed by processing the front and back surfaces of the substrate, the shape of the via holes can be easily controlled, and ultra thinning of the substrate is not required.

Further, according to this embodiment, the communication holes 40 are formed from the second surface 21B while the buried conductor layers 27 are formed on the first surface 21A. Therefore, the communication holes can be formed without the need for high alignment accuracy in comparison to the case in which contact holes are formed toward a wiring layer in the element forming layer, thereby facilitating the formation of via holes. Further, ultra thinning of the semiconductor substrate is not required, thereby improving workability and productivity. In this case, the width (or the diameter) of the communication holes can be set to be larger than the width (or the diameter) of the buried conductor layers, for example, larger than the alignment accuracy.

Second Embodiment

Figure 11:
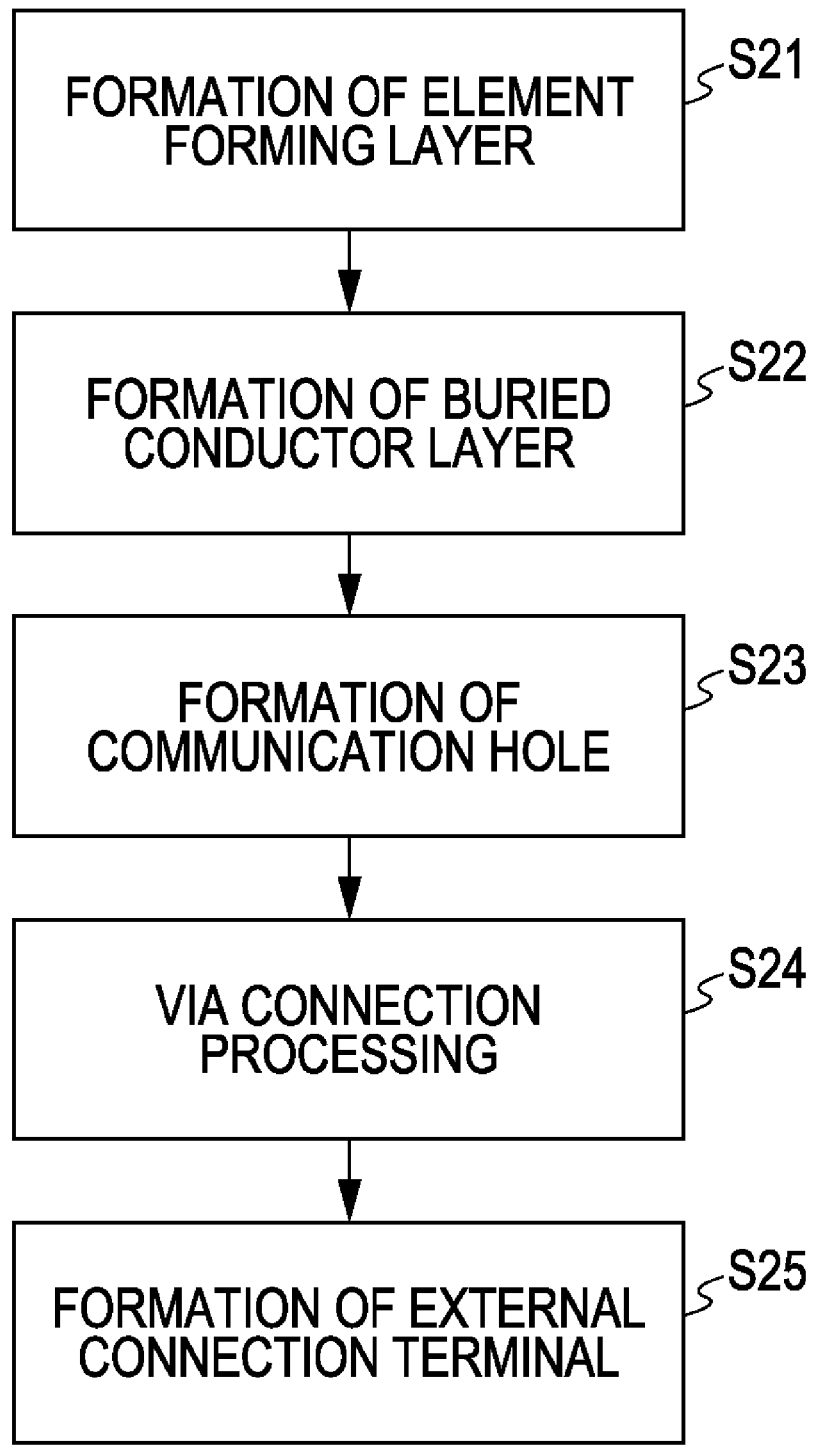
FIG. 11 is a flowchart illustrating a method for manufacturing a semiconductor device according to a second embodiment of the present invention.

FIG. 11 is a flowchart illustrating a method for manufacturing a semiconductor device according to a second embodiment of the present invention. The method for manufacturing a semiconductor device of this embodiment includes the steps of forming an element forming layer on a first surface of a semiconductor substrate (S21), forming buried conductor layers on the first surface of the semiconductor substrate through the element forming layer (S22), forming communication holes in the second surface of the semiconductor substrate so that the communication holes communicate with the buried conductor layers (S23), electrically connecting the buried conductor layers and the communication holes (S24), and forming external connection terminals on the second surface of the semiconductor substrate (S25).

In other words, in the first embodiment, the step of forming buried conductor layers is performed before the step of forming an element forming layer. However, this embodiment is different from the first embodiment in that the step of forming buried conductor layers is performed after the step of forming an element forming layer.

Figure 12A:
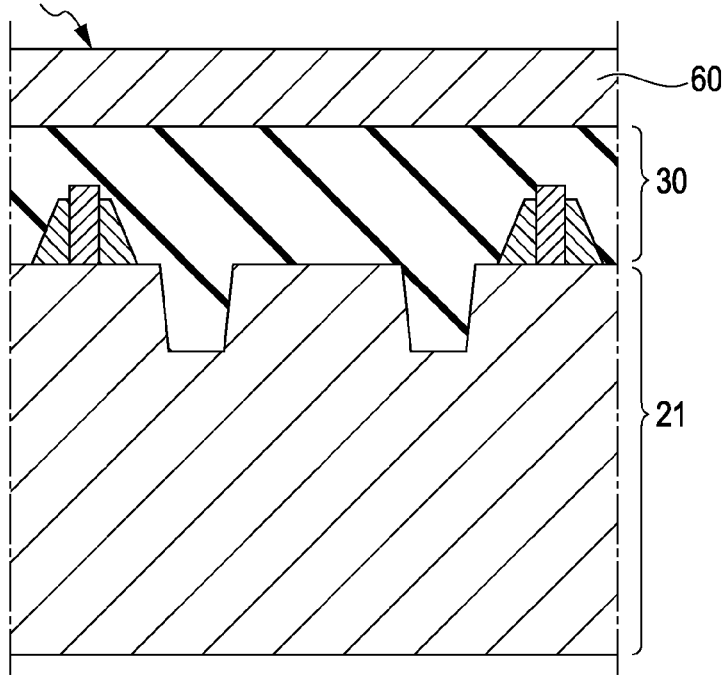
FIGS. 12A and 12B are sectional views of a principal portion, for illustrating the step of forming a buried conductor layer according to the second embodiment of the present invention.

FIGS. 12A to 14F are sectional views of a principal portion, for illustrating the step of forming the buried conductor layers in the second embodiment. FIG. 12A shows the state in which an element forming layer 30 is formed on a first surface 21A of a substrate body 21. In each of the figures, a portion corresponding to the first embodiment is denoted by the same reference numeral as in the first embodiment, and detail description thereof is omitted.

Figure 12B:
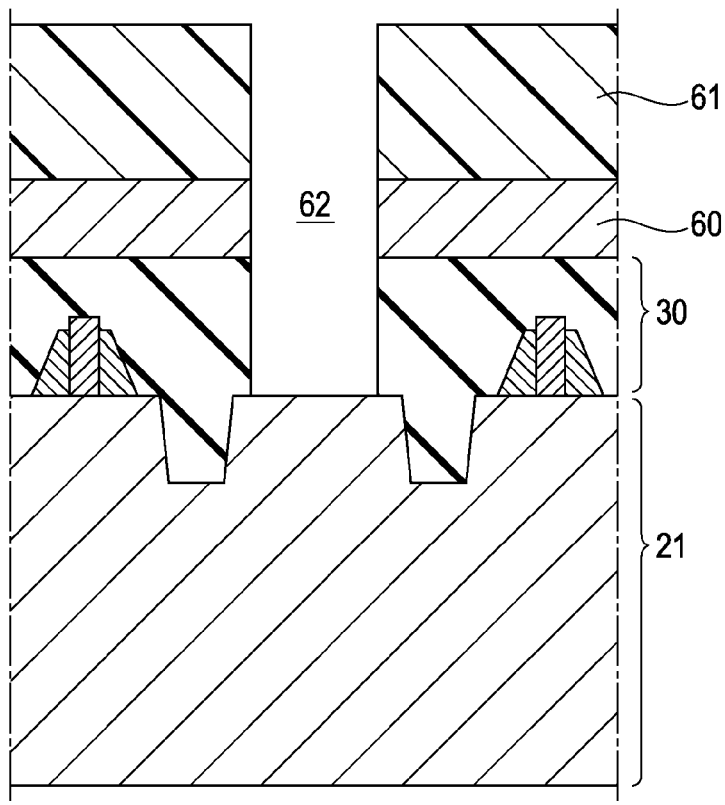

Also, a hard mask layer 60 including a SiN or $SiO_2$ film used for forming the buried conductor layers is formed on the element forming layer 30. Then, as shown in FIG. 12B, a resist mask 61 is formed on the hard mask 60, and a hole 62 is formed to pass through the element forming layer 30 and the hard mask 60. The hole 62 is provided in a region of the element forming layer 30 where a semiconductor element and wiring are not formed.

Figure 13C:
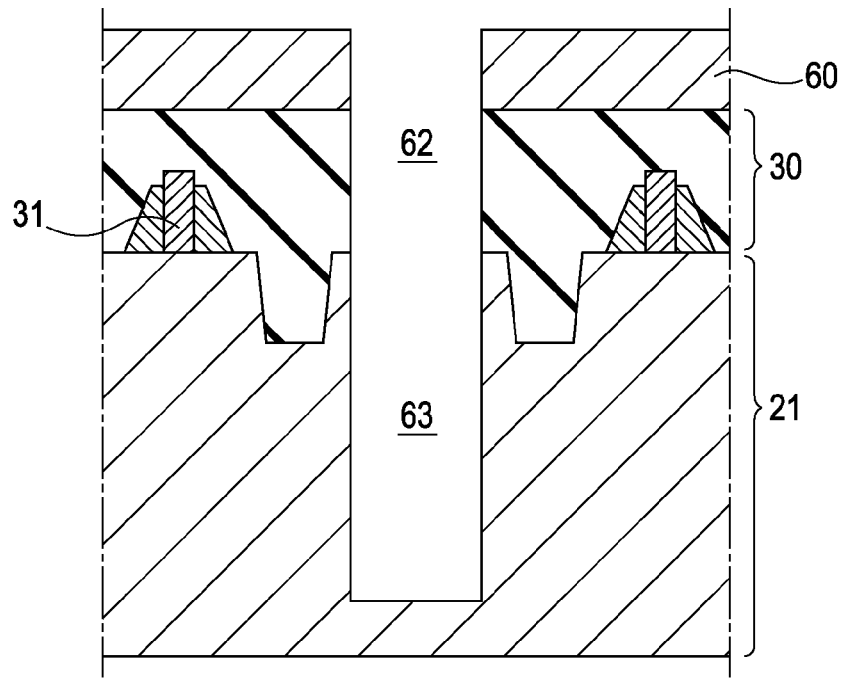
FIGS. 13C and 13D are sectional views of a principal portion, for illustrating the step of forming a buried conductor layer according to the second embodiment of the present invention.

Next, as shown in FIG. 13C, the resist mask 61 is removed, and then, a hole 63 with a bottom is formed in the substrate body 21 by etching using the hard mask layer 60 as a mask. The hole 63 with a bottom is formed to such a desired depth that the hole does not pass through the substrate body 21. In description below, the hole 62 and the hole 63 with a bottom are generally named the hole with a bottom.

Figure 13D:
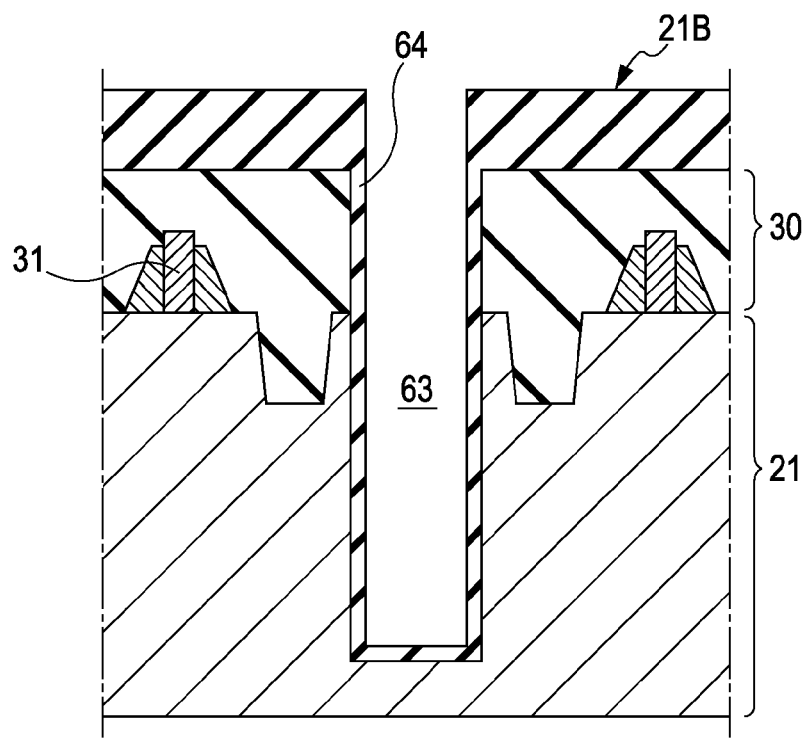

Next, as shown in FIG. 13D, in order to electrically insulating between the inside of the hole with a bottom and the substrate body 21, an insulating film 64 is formed to a thickness of, for example, 15 nm, on the second substrate 21B of the substrate body 21 so as to cover the inner wall of the hole with a bottom. As the constituent material of the insulating film 64, for example, the same insulating material (SiN or $SiO_2$) as that for the hard mask 60 can be used. In description below, the hard mask layer 60 and the insulating film 64 are generally named the insulating film 64.

Figure 14E:
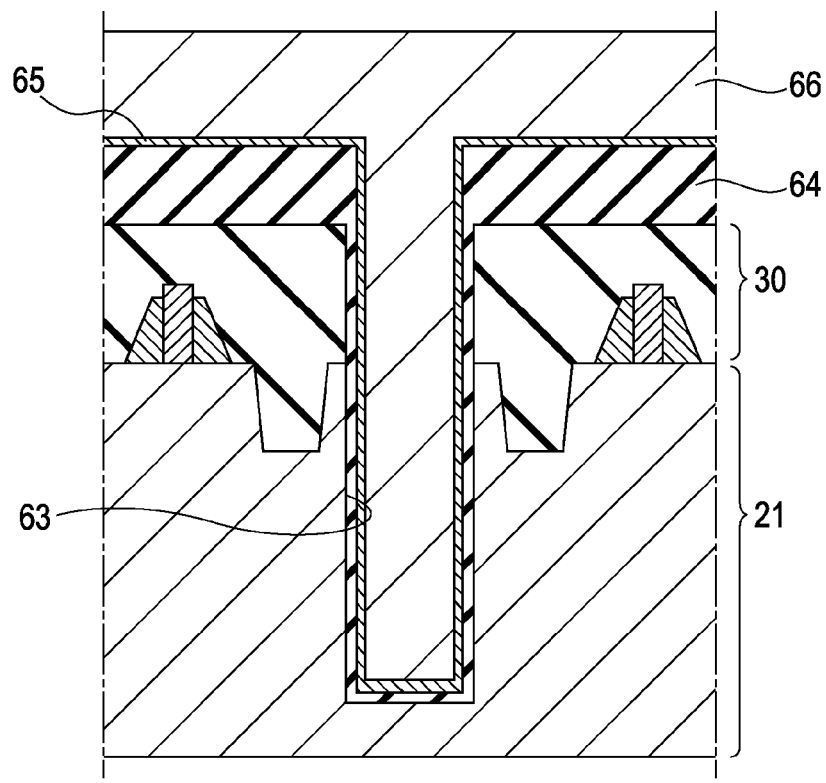
FIGS. 14E and 14F are sectional views of a principal portion, for illustrating the step of forming a buried conductor layer according to the second embodiment of the present invention.

Next, as shown in FIG. 14E, an underlying layer 65 is formed on the insulating layer 64, and then a W (tungsten) film 66 is deposited to fill the hole with a bottom with the W film 66. When the W film 66 is deposited, a method can be used, in which the insulating film 64 is modified with ammonia plasma, a WN film is formed as the underlying layer 65 by a CVD or ALD process, and then the W film 66 is formed by a CVD process to fill the hole with a bottom. A barrier metal (Ti/TiN) layer may be used as the underlying layer 65. In this case, Ti is deposited by a PVD process, TiN is deposited by a CVD process and further annealed at, for example, 550° C., and then the W film 66 is deposited.

Figure 14F:
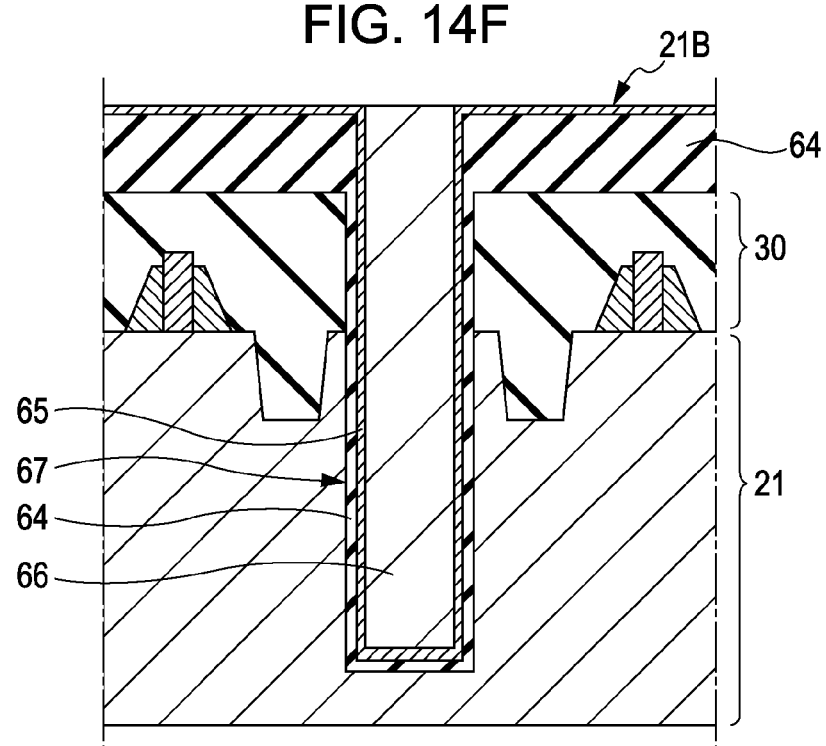

Then, as shown in FIG. 14F, the W film 66 and the barrier metal layer 65 covering the second surface 21B of the substrate body 21 are removed by a CMP or etch back process. As a result, a buried conductor layer 67 including a W plug 66 is formed in the substrate body 21 through the above-mentioned damascene process.

The semiconductor device according to the present invention is manufactured through the step of forming a communication hole on the second surface side of the substrate body 21 so that the communication hole communicates with the buried conductor layer 67 (S23), the via connection processing step of electrically connecting the communication hole and the buried conductor layer 67 (S24), and the step of forming an external connection terminal on the second surface side of the substrate body 21 (S25). The steps S23 to S25 are the same as the steps S13 to S15 of the first embodiment, and thus detailed description thereof is omitted.

According to this embodiment, the same effect as that of the first embodiment can be obtained. In particular, the conductor plug constituting the buried conductor layer 67 is composed of metal tungsten. However, the buried conductor layer 67 is formed after the element forming layer 30 is formed, and thus the problem of substrate cracking or warping due to a difference in thermal expansion can be avoided. The material of the conductor plug is not limited to metal tungsten, and another metal material such as copper or a semiconductor material such as polysilicon may be used.

When the metal tungsten plug is used for the buried conductor layer 67, via resistance can be decreased to a level lower than that in the first embodiment. For example, when the shape of the W plug 66 is 0.5 μm in diameter and 1 μm in depth, the plug resistance is 0.5Ω. When the via resistance is set to 5 mΩ, 100 W plugs are arrayed in a 5 μm×5 μm square. The communication holes are square holes of 9 μm square or more.

Although the embodiments of the present invention are described above, of course, the present invention is not limited to these embodiments, and various modifications can be made on the basis of the technical idea of the present invention.

Figure 15:
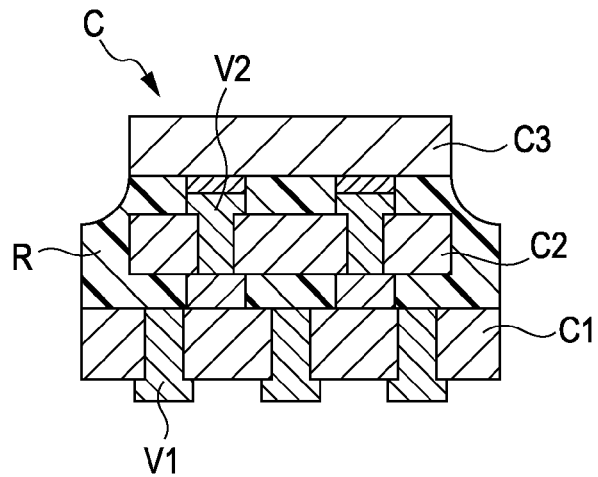
FIG. 15 is a schematic sectional view showing another example of the constitution of a COC structure semiconductor device to which the present invention can be applied.
Figure 16:
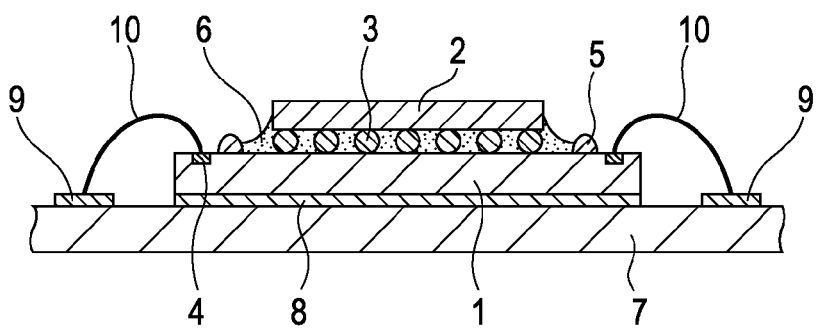
FIG. 16 is a schematic sectional view showing an example of the constitution of a conventional semiconductor device with a chip-on-chip structure.
Figure 17:
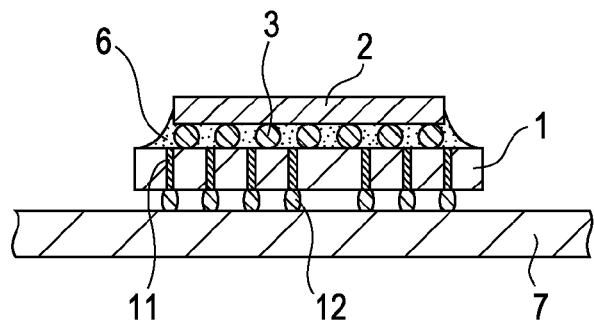
FIG. 17 is a schematic sectional view showing another example of the constitution of a conventional semiconductor device with a chip-on-chip structure.

For example, in each of the above-described embodiments, description is made of an example in which the manufactured semiconductor substrate with via holes is applied to a lower semiconductor substrate in a COC-structure semiconductor device. However, application is not limited to this. As schematically shown in FIG. 15, in a COC device with a three-layer structure including first to third semiconductor chips C1 to C3, the present invention can be applied to a via forming method and a via structure of the lowermost first semiconductor chip C1 and the intermediate second semiconductor chip C2 having via holes V1 and V2, respectively. In FIG. 15, character R denotes a resin layer for protecting the joint portions between the semiconductor chips C1 to C3.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device comprising the steps of:
   providing an element forming layer on a first surface of a semiconductor substrate; and
   providing an external connection terminal on a second surface of the semiconductor substrate opposite to the first surface so that the external connection terminal is electrically connected to the element forming layer through a via hole;
   wherein,
   the via hole is formed through the steps of forming a buried conductor layer on the first surface so as to electrically insulate the buried conductor layer from the semiconductor substrate, forming a communication hole on the second surface so as to communicate it with the buried conductor layer, and electrically connecting the buried conductor layer and the communication hole,
   the step of electrically connecting the buried conductor layer and the communication hole includes the steps of insulating the inner surface of the communication hole, removing the insulating film covering the bottom of the buried conductor layer, and forming a conductor film simultaneously covering the inner surface of the communication hole and the bottom of the buried conductor layer, and
   the step of removing the insulating film includes forming the communication hole with a width larger than the width of the buried conductor layer, forming an insulating protective film so that the deposit at the bottom of the communication hole is larger than that at the bottom of the buried conductor layer, etching out the protective film formed at the bottom of the buried conductor layer, and selectively etching out the insulating film exposed in the communication hole.

2. The method according to claim 1, wherein the step of forming the buried conductor layer is performed before the element forming layer is formed.

3. The method according to claim 1, wherein the step of forming the buried conductor layer is performed after the element forming layer is formed.

4. The method according to claim 1, wherein in the step of forming the communication hole, the width of the communication hole is larger than the width of the buried conductor layer.

5. The method according to claim 1, wherein a plurality of buried conductor layers is formed in parallel so that the electric resistance of the via hole is controlled by controlling the number of the buried conductor layers connected to the communication hole.

6. The method according to claim 1, wherein the electric resistance of the via hole is controlled by controlling the connection length of the via hole to the buried conductor layer.

7. The method according to claim 1, wherein a silicon oxide film formed by a high-density plasma CVD process is used as the protective film.

* * * * *